United States Patent [19]

Zook

[11] Patent Number: 5,724,368

[45] Date of Patent: Mar. 3, 1998

[54] CYCLICAL REDUNDANCY CHECK METHOD AND APPARATUS

[75] Inventor: Christopher P. Zook, Longmont, Colo.

[73] Assignee: Cirrus Logic, Inc., Fremont, Calif.

[21] Appl. No.: 725,320

[22] Filed: Oct. 2, 1996

Related U.S. Application Data

[63] Continuation of Ser. No. 325,717, Oct. 18, 1994, Pat. No. 5,671,237, which is a continuation of Ser. No. 147,865, Nov. 4, 1993, Pat. No. 5,465,260.

[51] Int. Cl.$^6$ ............................................. H03M 13/00
[52] U.S. Cl. ................................. 371/37.7; 371/40.1
[58] Field of Search ............................ 371/37.7, 38.1, 371/39.1, 40.1

[56] References Cited

U.S. PATENT DOCUMENTS

| | | | |
|---|---|---|---|
| 4,413,339 | 11/1983 | Riggle et al. | 371/40.1 |
| 4,564,945 | 1/1986 | Glover et al. | 371/40.1 |
| 4,775,978 | 10/1988 | Hartness | 371/40.1 |
| 4,907,233 | 3/1990 | Deutsch et al. | 371/37.4 |
| 5,134,619 | 7/1992 | Henson et al. | 371/40.1 |
| 5,182,752 | 1/1993 | DeRoo et al. | 371/37.7 |
| 5,375,127 | 12/1994 | Leak et al. | 371/40.1 |
| 5,422,895 | 6/1995 | Nguyen et al. | 371/37.5 |
| 5,444,719 | 8/1995 | Cox et al. | 371/37.1 |

Primary Examiner—Stephen M. Baker
Attorney, Agent, or Firm—Nixon & Vanderhye; Dan A. Shifrin

[57] ABSTRACT

A one stage CRC generation system (400) and a two stage CRC generation system (600) feature a CRC generator/checker (700) which outputs a programmable number of CRC bytes. The CRC generation/checker (700) comprises a segmenting circuit (710) [for segmenting an input stream of user data into a plurality m of sub-streams]; a circuit (712) which forms a linear combination of the plurality m of sub-streams and operates upon the linear combination in order to generate CRC bytes; and, a checker circuit (714) for comparing the generated CRC bytes with previously generated CRC bytes. The two stage system (600) includes a first CRC generator/checker (601); a memory (602) which receives both the user data and $K_1$ number of primary CRC bytes generated by first CRC generator/checker (601); and, a second CRC generator/checker (603) which uses the primary CRC bytes and $K_1$ number of its own generated verification CRC bytes to check the user data after retrieval from memory (602) and prior to encoding. In addition, second CRC generator/checker (603) can optionally apply $K_2-K_1$ number of its verification CRC bytes to encoder (604) for use as secondary CRC bytes. The number of CRC bytes $K_1$ and $K_2$ actually outputted by the respective CRC generator/checkers (601,603) is programmable.

62 Claims, 8 Drawing Sheets

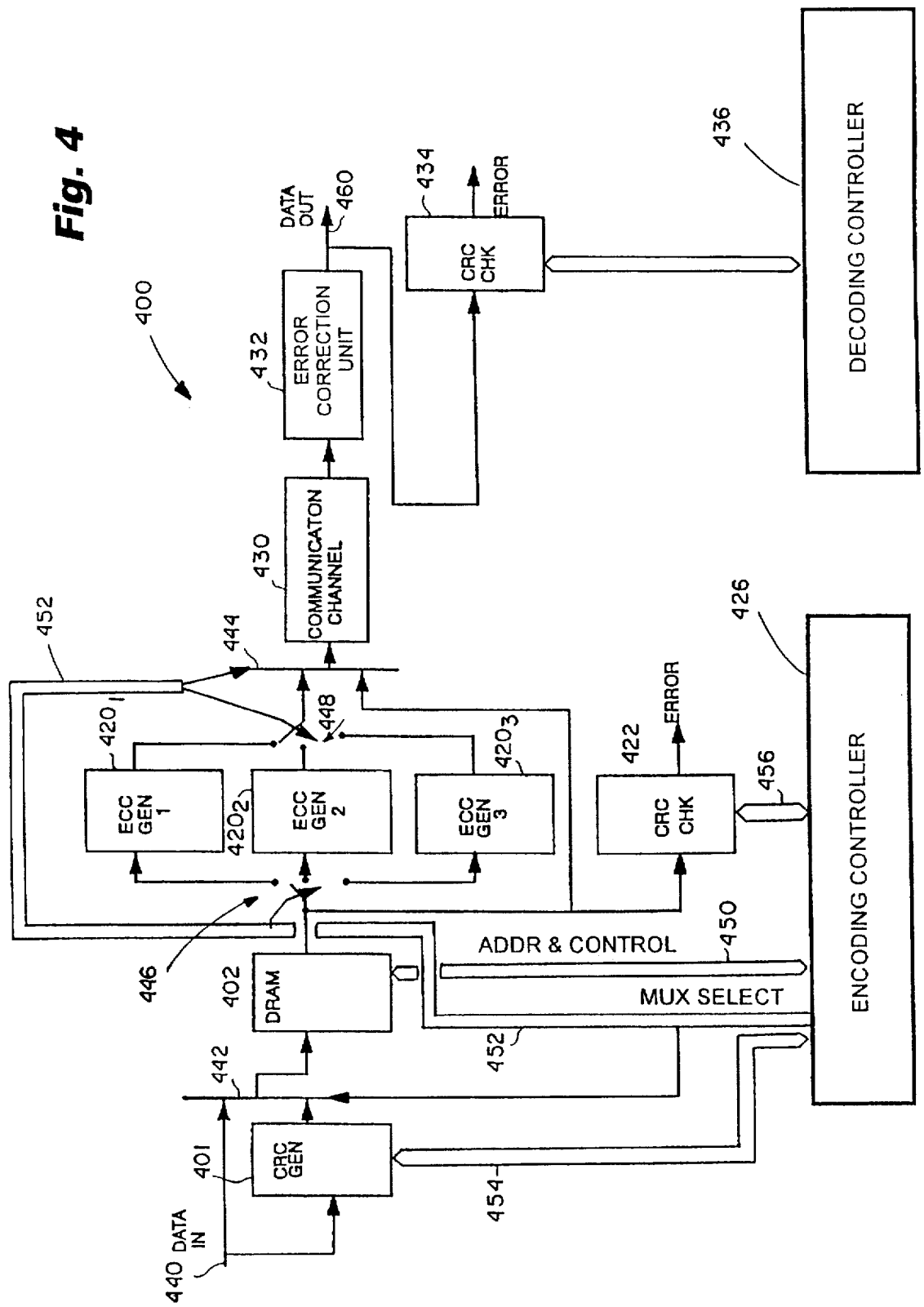

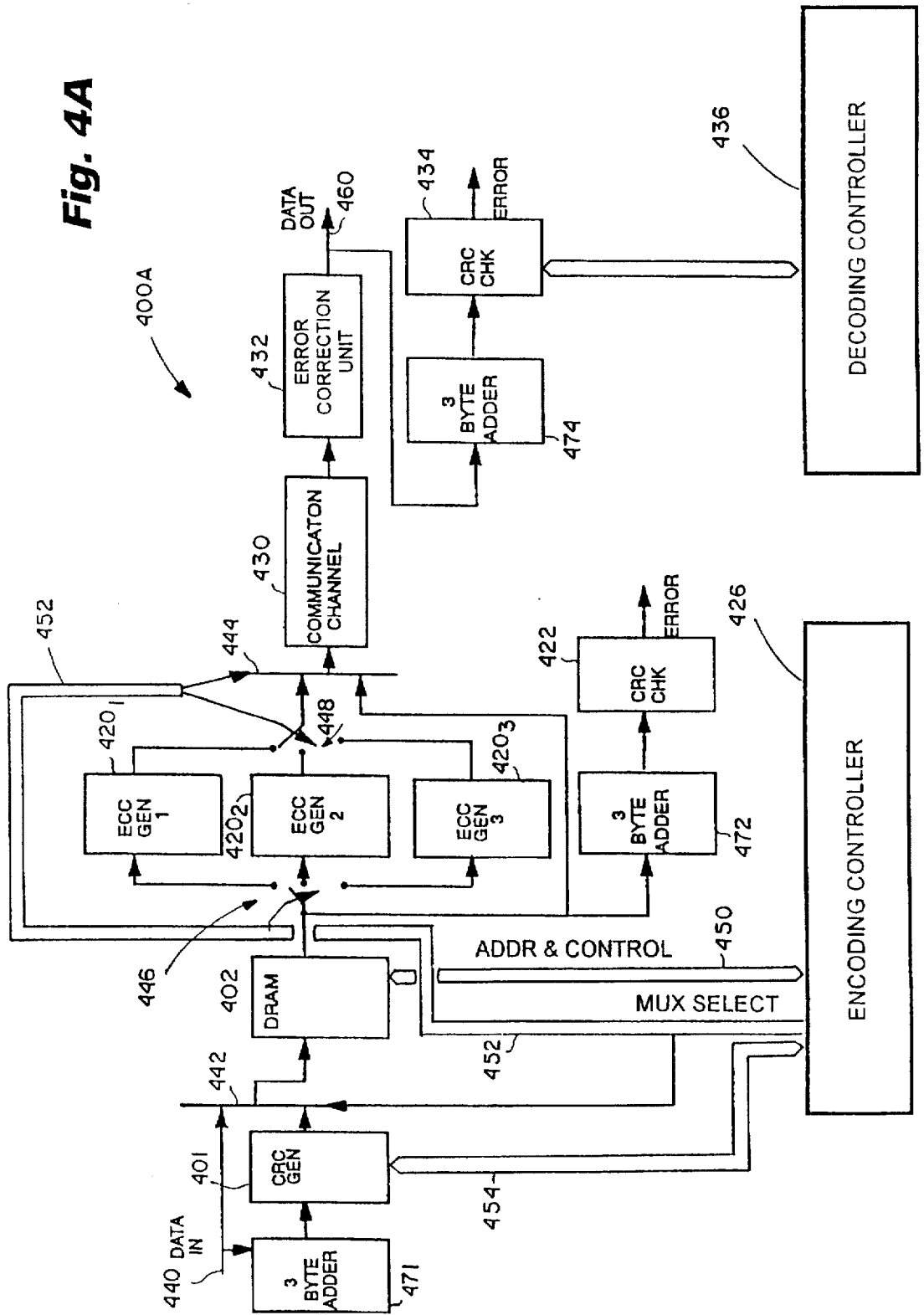

CYCLICAL REDUNDANCY CHECK METHOD AND APPARATUS

CROSS-REFERENCE TO RELATED APPLICATIONS

This patent application is a continuation application of U.S. patent application Ser. No. 08/325,717, filed Oct. 18, 1994, now U.S. Pat. No. 5,671,237, which is a continuation of 08/147,865, filed Nov. 4, 1993 now U.S. Pat. No. 5,465,260, entitled DUAL PURPOSE CYCLICAL REDUNDANCY CHECK, which is incorporated herein by reference. Patent applications filed concurrently (inventor: Christopher P. Zook) with this patent application and incorporated herein by reference include U.S. Patent application Ser. No. 08/325,831 entitled "FINITE FIELD INVERSION"; U.S. patent application Ser. No. 08/325,850 entitled "BURST ERROR CORRECTOR", U.S. patent application Ser. No. 08/326,164 entitled "REED SOLOMON DECODER", and U.S. patent application Ser. No. 08/326,126 entitled "ERROR CORRECTION METHOD AND APPARATUS". Patent applications filed concurrently with U.S. patent application Ser. No. 08/147,865 filed Nov. 4, 1993 (and all hereby incorporated herein by reference) include U.S. patent application Ser. No. 08/147,758 entitled "FINITE FIELD INVERSION", U.S. patent application Ser. No. 08/148,068 entitled "BURST ERROR CORRECTOR", and U.S. patent application Ser. No. 08/147,650, entitled "REED SOLOMON DETECTOR".

BACKGROUND

1. Field of Invention

This invention relates generally to digital data communication systems, particularly to the detection of transmission errors by the use of codes.

2. Related Art and Other Considerations

In a digital data communication system (including storage and retrieval from electronic memory, optical media or magnetic media) errors may occur as a result of noise, media defects or circuit failure. For reliable communications it is necessary to be reasonably sure of detecting all transmission errors. One way of doing this is by the use of cyclic redundancy check symbols or CRCs. In general CRCs are calculated by treating the data as the coefficients of a polynomial, dividing the data by another polynomial, and keeping the remainder. The data and CRC together make up a codeword which is then transmitted into the communication channel. At a receiving end of the channel a CRC is again calculated and compared to the original. A discrepancy between the two CRCs indicates a transmission error.

In some applications the data and CRC together are coded into an error-correcting code by adding error-correcting characters (ECC). After a correction procedure has been used the CRC can be used to detect errors that are either not detected or are miscorrected by the corrector.

The data can be viewed as a sequence of binary bits or a sequence of multi-bit symbols. In general a bit-oriented CRC is desired if the expected errors are random bit errors and a symbol-oriented CRC is desired if the expected errors are burst errors or random symbol errors.

FIG. 1 shows a typical bit-oriented 8-bit CRC generator where the serial input is on the DATA line. The generator in FIG. 1 will generate an 8-bit CRC character which can be used to detect any error which affects at most two bits in the serial data stream.

FIG. 2 shows a typical byte-oriented 8-bit CRC generator where $D_0$ to $D_7$ make up the input data byte. The generator in FIG. 2 will generate an 8-bit CRC character which can be used to detect any single-byte error. It cannot, however, detect every two-bit error since the two errors could be in two different bytes.

FIG. 3 shows a data transmission system which includes a dynamic RAM (DRAM) for temporary storage and a communication channel which could be, for example, magnetic storage. The system uses an ECC system to correct errors occurring in the communication channel. It also employs a two-byte CRC to check for errors in data retrieved from the DRAM and to check the results of the corrector. For ECC purposes the data is partitioned into three interleaves. Each interleave makes up one ECC codeword containing two ECC bytes which can correct one byte in each interleave. This is a common technique for making a system capable of correcting a burst error of three bytes but using an ECC capable of correcting only one byte. Conceptually, during ECC generation using the system of FIG. 3, the first data byte goes into ECC generator 1, the second byte goes into ECC generator 2, the third byte goes into ECC generator 3, the fourth byte goes into ECC generator 1, etc. After the data has been input to the generators the first ECC byte comes from the generator which follows the generator which received the last data byte and the remaining ECC bytes are taken from the generators in the same sequence as previously described. All signal lines are 8 bits wide.

The CRC system of FIG. 3 will detect all two-byte errors (and consequently all two-bit errors) in a block of data read from the DRAM. However, regardless of which CRC and ECC polynomials are used, it is possible to have three errors in one interleave which are not detected by the ECC or CRC.

SUMMARY

The invention features both one stage and two stage CRC generation systems which include a programmable CRC generator/checker. The CRC generation/checker comprises a segmenting circuit (for segmenting an input stream of user data into a plurality m of sub-streams); a circuit which forms a linear combination of the plurality m of sub-streams and operates upon the linear combination in order to generate CRC bytes; and, a checker circuit for comparing the generated CRC bytes with previously generated CRC bytes.

In connection with preparation of CRC bytes prior to an encoding operation of a two stage system, input user data is first applied to a first CRC generator/checker for the generation of $K_1$ number of primary CRC bytes. The input user data and associated resultant CRC bytes are then stored in a memory. Prior to encoding, a data block obtained from the memory (including both the user data and the primary CRC bytes) is applied to a second CRC generator/checker. User data from the memory is utilized by the second CRC generator/checker to generate verification CRC bytes. Following generation of the verification CRC information units, during $K_1$ number of verification clock cycles, the first $K_1^{th}$ verification CRC bytes are compared with the $K_1$ number of primary CRC bytes for the purpose of detecting any errors occurring with respect to the memory. After the verification, a number $K_2$–$K_1$ of verification CRC bytes generated by the second CRC generator/checker is optionally applied to the encoder as secondary CRC bytes, thereby adding additional CRC information prior to encoding and storage of a block on a storage medium.

In connection with processing of CRC information after a decoding operation of a two stage system, decoded user data (including CRC bytes) is applied both to the second CRC generator/checker and to the memory. The second CRC generator/checker receives the user data and CRC bytes in much the same manner as it does prior to an encoding operation, generating $K_2$ number of verification CRC bytes for comparison with a like number of corresponding CRC bytes obtained from the decoded data. When the decoded data is retrieved from the memory for sending to a host, the decoded data is sent to the first CRC generator/checker to check for memory errors.

The first CRC generator/checker and the second CRC generator/checker are configured to generate as many as k number of CRC bytes. However, the number of CRC bytes $K_1$ and $K_2$ actually outputted by the respective first and second CRC generator/checkers is programmable, so that $K_1$ and $K_2$ may be unequal (e.g., $K_2>K_1$) for a specified encoding/decoding operation and changeable from one encoding/decoding operation to another.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 4 is a schematic block diagrammatic view of a one stage CRC generation system according to an embodiment of the invention and provided with memory error checking.

FIG. 4A a schematic block diagrammatic view of a one stage CRC generation system of FIG. 4 which uses an adder and a conventional CRC generator.

DETAILED DESCRIPTION OF THE DRAWINGS

Figure 6:
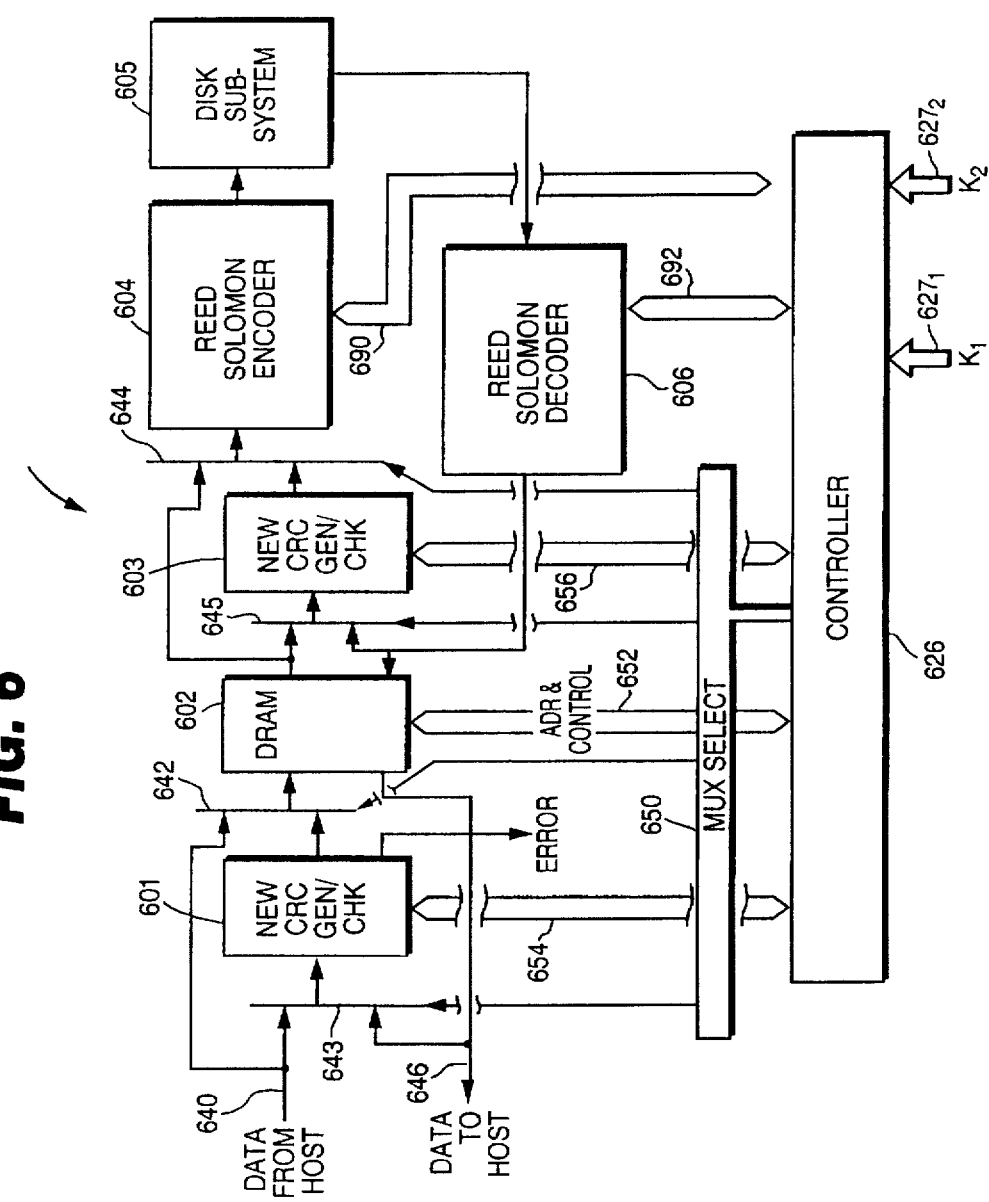
FIG. 6 is a schematic block diagrammatic view of a two stage CRC generation system according to an embodiment of the invention.

The invention includes both one stage and two stage CRC generation systems. FIG. 4 shows a generalized one stage CRC generation system 400 collaterally provided with memory error checking; FIG. 6 shows a generalized two stage CRC generation system 600 with in-line memory checking. As discussed subsequently, both one stage CRC system 400 and two stage CRC system 600 employ a CRC generator/checker which can be a novel CRC generator/checker of the type basically illustrated in FIG. 7. In the embodiments illustrated in FIG. 4 and FIG. 6 the CRC systems 400 and 600 are used in conjunction with an ECC system which, in the preferred embodiment, is a three-way interleaved Reed-Solomon code.

The invention includes a method and apparatus that is capable of generating and checking CRC information units (e.g., bytes) and which is order-programmable. The CRC bytes are used to detect random errors occurring in DRAM and also to detect uncorrectable errors occurring in the communication channel.

SINGLE STAGE SYSTEM

The one stage CRC generation system 400 of FIG. 4 includes an encoding side and a decoding side. The encoding side of system 400 comprises CRC generator 401; memory (e.g., DRAM) 402; a set of ECC generators $420_1$, $420_2$, $420_3$; and a CRC checker circuit 422, all under control of encoding controller 426. The encoding side of system 400 applies encoded data (including both CRC and ECC bytes) to a communication channel 430. Communication channel 430 in turn outputs received data to the decoding side. The decoding side of system 400 includes a error correction unit 432 and a CRC checker circuit 434, both under the control of decoding controller 436.

The encoding side of system 400 receives input electrical signals at a port 440 (e.g., a port from a host device). As used herein, a port such as port 440 receives a sequence of electrical signals representing a user data stream, the user data stream comprising bytes where each byte is an element of the finite field $GP(2^p)$ and where a byte can be of any p-bit arbitrary length. The user data stream is organized into blocks of electrical signals representing digital data, each block containing n data symbols, wherein each block is mathematically represented by the polynomial D(x).

The electrical signals from port 440 are applied both to an input port CRC generator 401 and a first input port of a multiplexer 442. An output port of CRC generator 401 is connected to a second input port of multiplexer 442. An output port of multiplexer 442 is connected to a data input port of DRAM 402. A data output port of DRAM 402 is connected to: a first input port of channel multiplexer 444; an input port of CRC checker 422; and (via ECC input multiplexer 446) to a selected one of the ECC generators $420_1$, $420_2$, $420_3$. Output ports of the ECC generators 420 are connected to respective input ports of ECC output multiplexer 448.

Encoding controller 426 controls the sequencing (e.g., timing) and operating of the constituent elements of the encoding side of system 400, including the application of signals (e.g., multiplexing) to and from such elements. Controller 426 is connected to DRAM 402 by an address and control bus 450; to MUXes 442, 444, 446, and 448 by a MUX SELECT bus 452; to CRC generator 401 by CRC generator control bus 454; and, to CRC checker 422 by CRC checker control bus 456. These and other unillustrated connections of controller 426 are understood by the man skilled in the art, such as unillustrated connections for controlling ECC generators 420, for example.

On the decoding side of system 400, error correction unit 432 receives and corrects data from channel 430. The corrected data is output on data bus 460, which data is also applied to CRC checker 434. Decoding controller 436 is connected by CRC checker control bus 462 to control the operation of CRC checker 434.

In one embodiment, the CRC generator 401, CRC checker 422, and CRC checker 434 take the form of a novel generator/checker subsequently illustrated with respect to FIG. 7. However, in another embodiment (system 400A)

illustrated in FIG. 4A. CRC generator 401, CRC checker 422, and CRC checker 434 are conventional CRC units augmented by m-way adder circuits 471, 472, and 474, respectively. That is, m-way adder circuits 471, 472, and 474 are connected upstream of the respective CRC generator/checkers 401, 422, 434. In other respects, the elements of system 400A resemble like-numbered elements of system 400.

Figure 5:
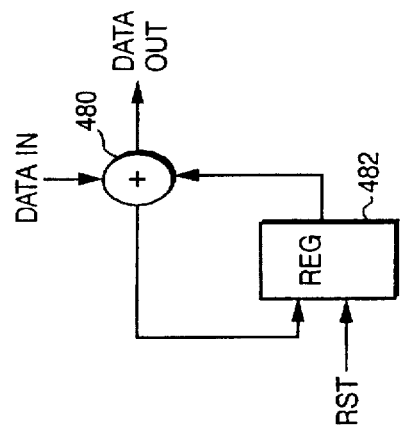
FIG. 5 a schematic block diagrammatic view of the adder of FIG. 4A.

FIG. 5 illustrates the configuration of m-way adder circuits 471, 472, and 474. Each m-way adder circuit includes an adder 480 and a register 482. In the system 400B shown in FIG. 4A, each m-way adder circuit is a 3-way adder circuit.

Figure 1:
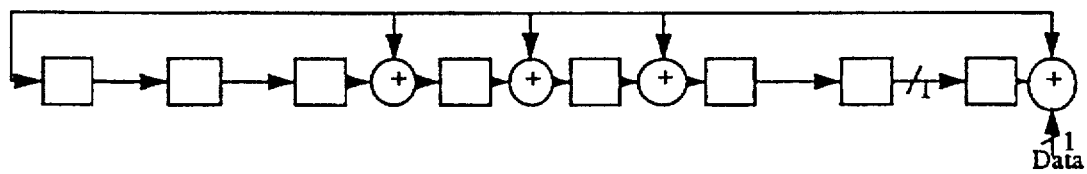
FIG. 1 is a schematic block diagrammatic view of a typical bit-oriented 8-bit CRC generator.
Figure 2:
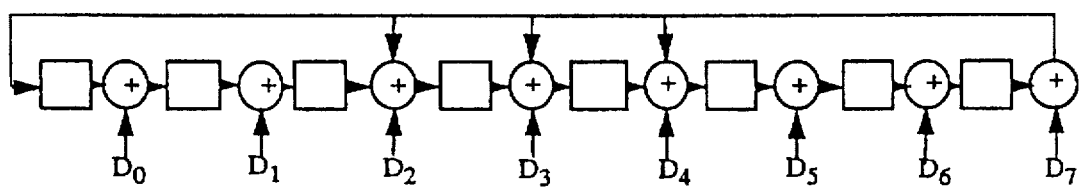
FIG. 2 is a schematic block diagrammatic view of a typical byte-oriented 8-bit CRC generator.
Figure 3:
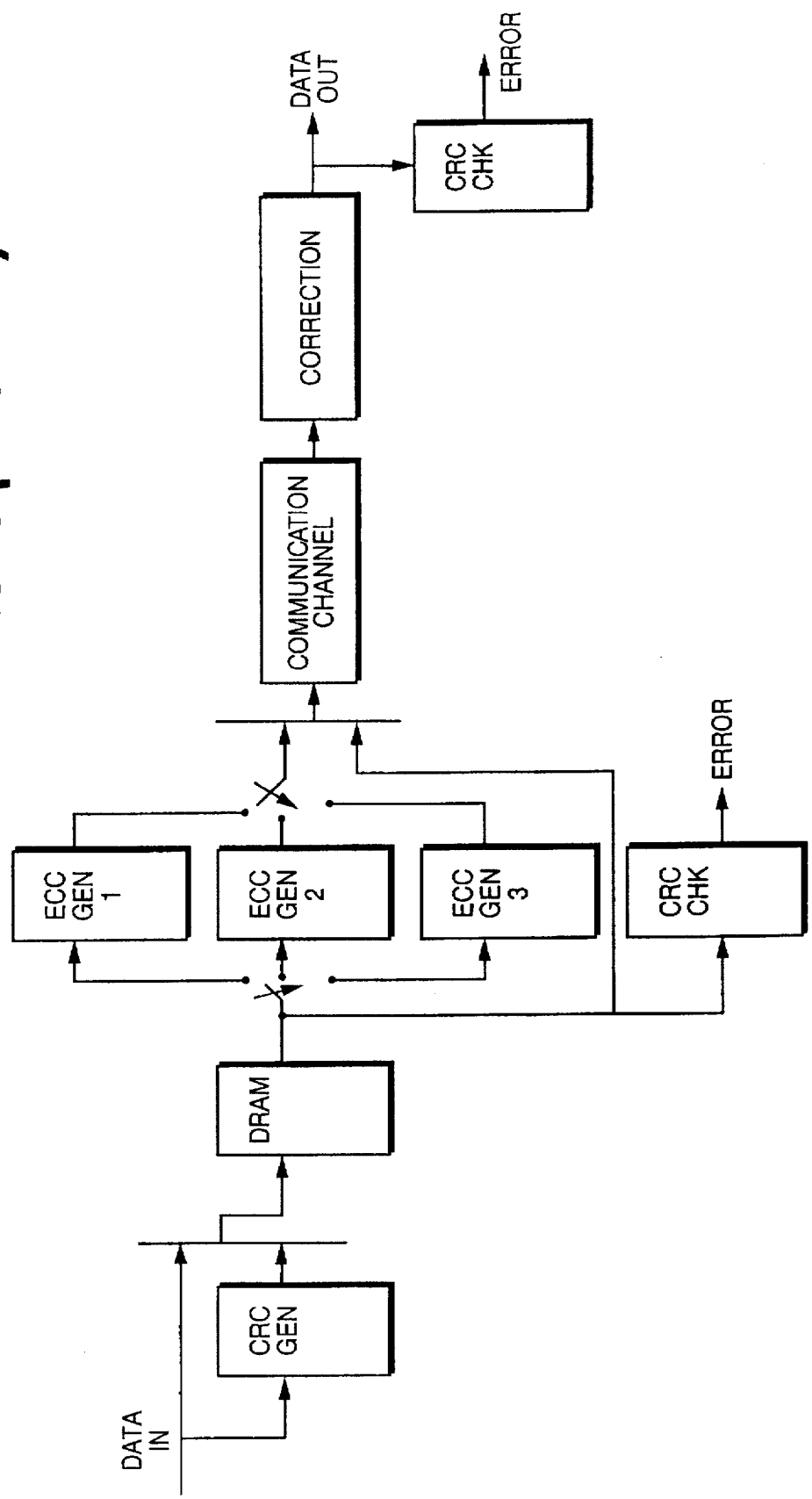
FIG. 3 is a schematic block diagrammatic view of a data path which includes a CRC generator and checker, a DRAM, and a communication channel with ECC protection.

The system 400A shown in FIG. 4A resembles that shown in FIG. 3, except that the input user data from port 440 is segmented into groups of three bytes. The sum of the three bytes in each group is sent to the conventional CRC generator 410. The first byte in each group will ultimately be sent to ECC generator $420_1$, the second byte in each group will ultimately be sent to ECC generator $420_2$, and the third byte in each group will ultimately be sent to ECC generator $420_3$. The CRC generator 401 is only clocked once for each three bytes. In FIG. 5 the register 482 is reset on the third clock of each three-byte group.

TWO STAGE SYSTEM

FIG. 6 shows a two stage CRC generation system 600 which generally comprises a first CRC generator/checker 601 for generating primary CRC information; a memory (e.g., DRAM) 602; a second CRC generator/checker 603 (for, e.g., generating secondary CRC information); an encoder (such as a Reed Solomon encoder) 604; a data utilization device (such as a disk sub-system) 605; a decoder (such as a Reed Solomon decoder) 606; and, a controller 626.

System 600 also includes a host port 640 connected to an unillustrated host device. Host port 640 is connected to apply an input user data stream to a first input port of DRAM input multiplexer 642 and to a first input port of first CRC generator multiplexer 643. An output port of multiplexer 643 is connected to an input port of first CRC generator/checker 601. An output port of generator/checker 601 is connected to a second input port of DRAM input multiplexer 642. An output port of DRAM multiplexer 642 is connected to a first input port of DRAM 602. A first output port of DRAM 602 is connected both to a first input port of encoder input multiplexer 644 and to a first input port of second CRC generator/checker multiplexer 645. An output port of multiplexer 645 is connected to an input port of second CRC generator/checker 603. An output port of generator/checker 603 is connected to a second input port of encoder input multiplexer 644. An output port of multiplexer 644 is connected to an input port of encoder 604.

Disk sub-system 605 has both a data input port and a data output port. The data input port of disk sub-system 605 is connected to receive data from an output port of encoder 604. The data output port of disk sub-system 605 is connected to apply data to an input port of decoder 606.

An output port of decoder 606 is connected both to a second input port of second CRC generator multiplexer 645 and to a second data input port of DRAM 602. DRAM 602 has a second output port which is connected both to a host port 646 and to a second input port of first CRC generator multiplexer 643.

Controller 626 is connected to control the timing and sequencing of the operation of the constituent elements of system 600 as explained herein and as otherwise understood by the man skilled in the art. For example, controller 626 is connected to multiplexers 642, 643, 644, and 645 by a multiplexer select bus 650; to DRAM 602 by a DRAM address and control bus 652; to first CRC generator/checker 601 by a first CRC generator control bus 654; to the second CRC generator/checker 603 by a second CRC generator control bus 656; to encoder 604 by encoder control bus 690; and, to decoder 606 by decoder control bus 692. Controller 626 has a plurality of input ports $627_1$ and $627_2$ for obtaining input values for programming system 600. In particular, input port $627_1$ receives a value $K_1$ determinative of the number of CRC bytes to be outputted by first CRC generator/checker 601; input port $627_2$ receives a value $K_2$ determinative of the number of CRC bytes to be outputted by second CRC generator/checker 603.

In system 600, the first CRC generator/checker 601 is connected (via MUX 643) to host port (640) for generating primary CRC information based on input user data received from the host device. Memory 602 stores input user data received from the host device and the primary CRC information generated with respect thereto by the first CRC generator/checker 601. Second CRC generator/checker 603, connected to memory 602 via MUX 645, serves to check data retrieved from memory 602 and (optionally) to generate secondary CRC information based on data obtained from memory 602 including the primary CRC information. Encoder 604 forms encoded information by utilizing the data obtained from memory 602 including the primary CRC information as well as optional secondary CRC information obtained from second CRC generator/checker 603.

Decoder 606 receives input data and decodes the input data into decoded input data including decoded CRC information. Decoder 606 applies the decoded input data including the decoded CRC information to second CRC generator/checker 603 and to memory 602. Second CRC generator/checker 603 validates the decoded CRC information included in the decoded input data. First CRC generator/checker 601 is connected to receive decoded input data including the decoded CRC information stored in memory 602 for validating decoded CRC information received from memory 602.

Thus, in an encoding operation, second CRC generator/checker 603 compares the primary CRC information and verification CRC information generated by second CRC generator/checker 603 to determine errors attributable to memory 602. Encoder 604 is also connected to second CRC generator/checker 603 and also utilizes the secondary CRC information to form the encoded information. Conversely, in a decoding operation, first CRC generator/checker 601 determines errors attributable to memory 602.

CRC GENERATOR/CHECKER STRUCTURE

Figure 7:
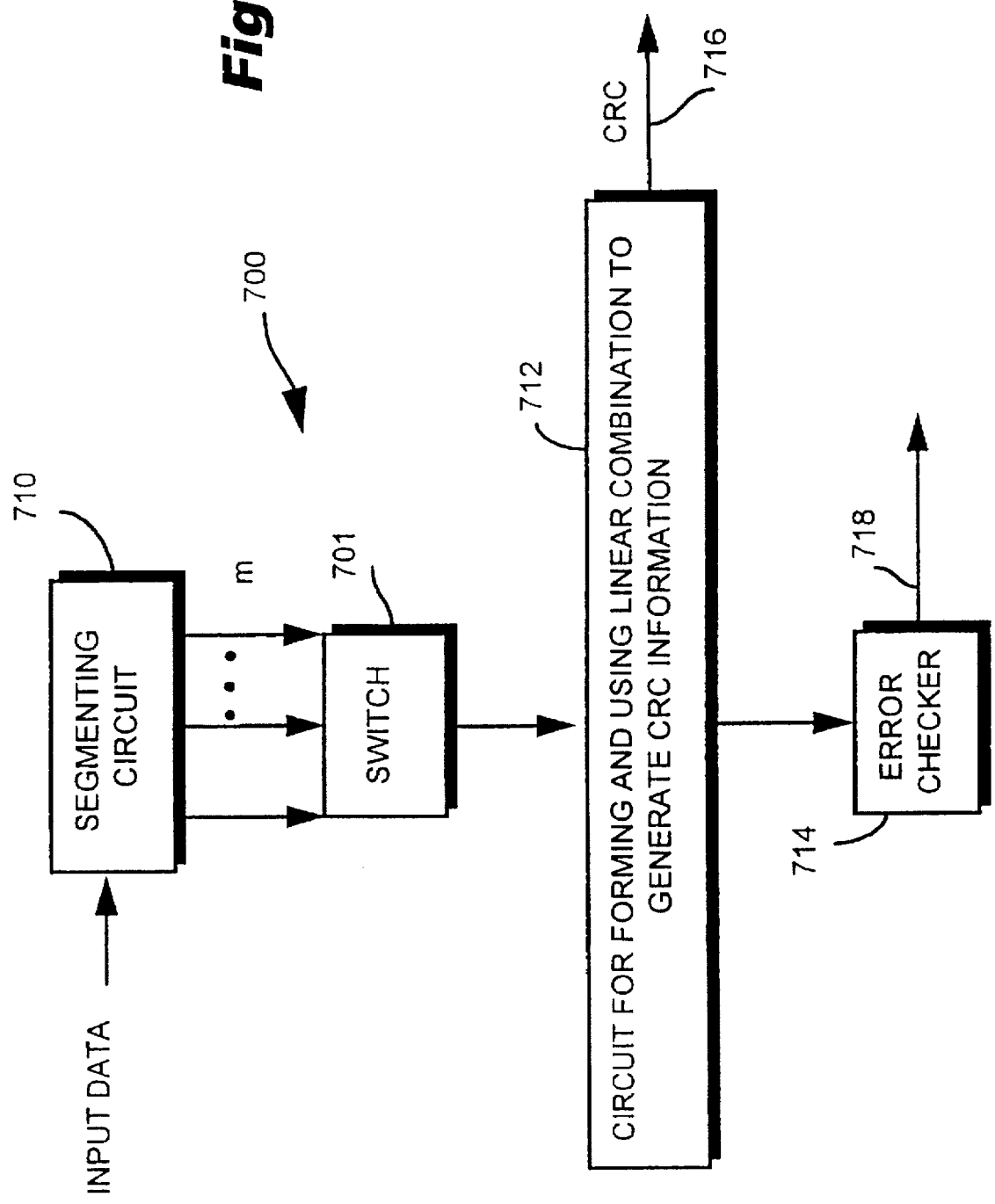
FIG. 7 is a schematic block diagrammatic view of a CRC generator/checker of the CRC generation system of FIG. 6.

FIG. 7 generally depicts a CRC generator/checker 700 suitable for use as the CRC generators and CRC checkers described herein. Generator/checker 700 basically includes a segmenting or interleaving circuit 710; a switch or multiplexer 701; a circuit 712 for forming and using a linear combination of user data sub-streams to generate CRC information; and, an error checker circuit 714. Segmenting circuit 710 serves to segment an input stream of user data into a plurality m of sub-streams for application to switch 701. Switch 701 selects from the plurality of user data sub-streams in accordance with clock cycle and applies the selected user data sub-stream to circuit 712. The resultant CRC information, preferably in the form of CRC bytes, is outputted on parallel CRC bus 716. When generator/checker 700 is employed to check received CRC information previously generated on the basis of received data, the previously generated CRC information is compared by error checker 714 with verification CRC information currently generated (with respect to the same user data) by circuit 712. Should the previously generated and currently generated verification CRC information differ, an error signal is generated on CRC error line 718.

Figure 7A:
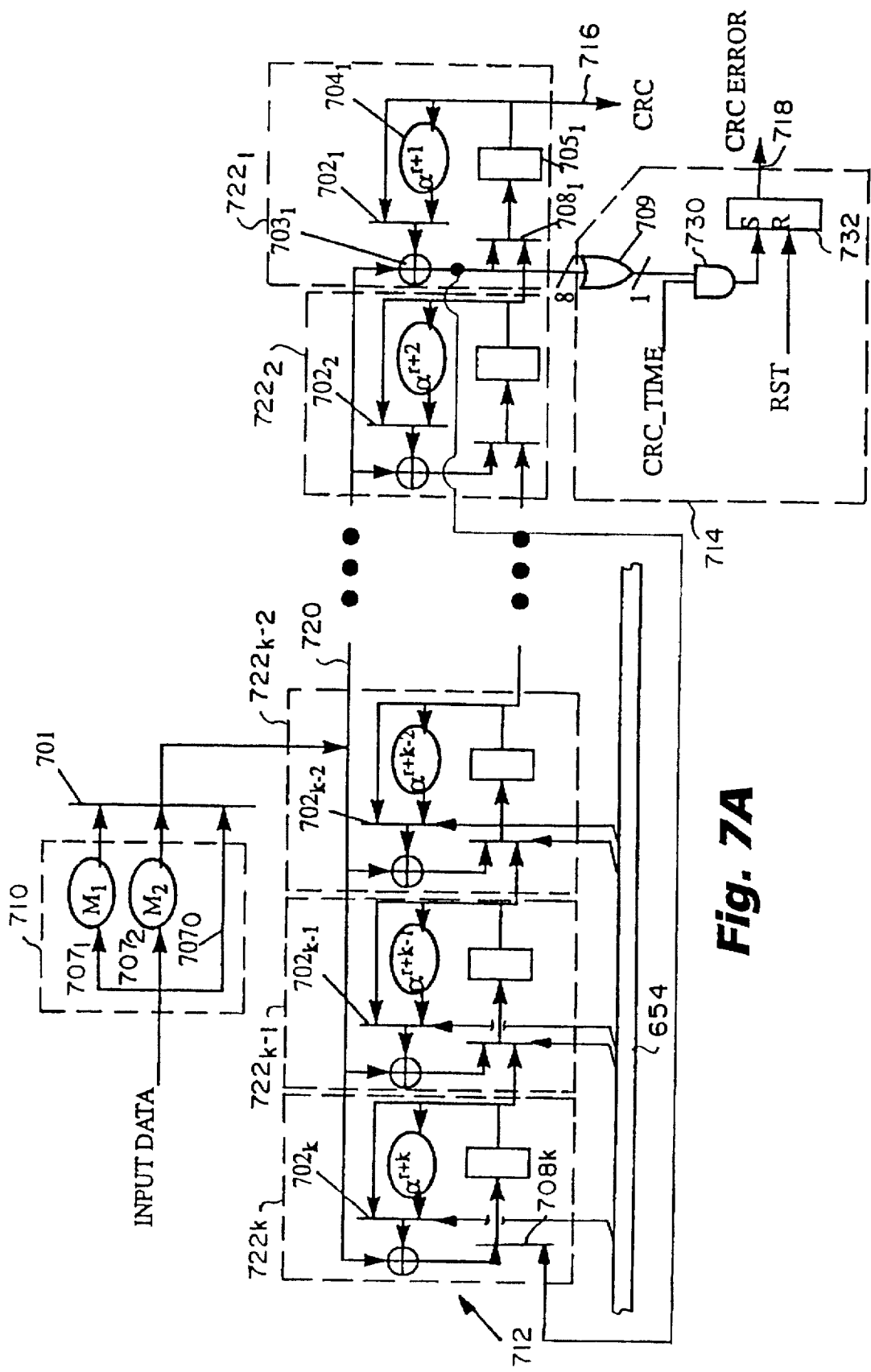
FIG. 7A is a detailed schematic block diagrammatic view of an embodiment of the CRC generator/checker of FIG. 7.

FIG. 7A shows structural details of one particular implementation of CRC generator/checker 700, and particular an implementation wherein m=3. Accordingly, segmenting circuit 710 of FIG. 7A is shown to include three sub-stream lines $707_0$, $707_1$, $707_2$. For reasons hereinafter discussed, sub-stream lines $707_1$ and $707_2$ have multipliers $M_1$ and $M_2$ connected thereon. Switch 701 is a three-input multiplexer having input selected by controller 626 (via a control bus). An output port of multiplexer 701 is connected to apply the sub-stream selected thereby to adder input bus 720.

As shown in FIG. 7A, circuit 712 comprises k number of sub-circuits $722_1$–$722_k$ for generating as many as k bytes of CRC information with respect to the linear combination of sub-streams. As explained below, each sub-circuit 722 is a divider having a divisor which is a power of α. Each sub-circuit 722 comprises an adder input multiplexer 702; an adder 703; a multiplier 704; a register 705 for storing CRC information; and, a register input multiplexer 708. Each adder 703 has a first input port, a second port, and an output port. The first port of each adder 703 is connected to adder input bus 720 so that the plurality of sub-streams can be multiplexed thereto. Each multiplier 704 has an output port thereof selectively connected (via a first input port of associated multiplexer 702) to the second input port of its associated adder 703. Each register 705 has an input port connected to the output port of associated adder 703 and its output port is selectively connected (via a first input port of associated multiplexer 702) to the second input port of the adder 703. Each register 705 stores CRC information in the form of a CRC byte which is related to an error correcting code. Each of the multiplexers 702 and 708 are controlled by controller 626 (for example, via control bus 654).

From the foregoing it is understood that sub-circuits circuits 722 are numbered from a first sub-circuit $722_1$ to a $k^{th}$ sub-circuit $722_k$. Registers 705 of the sub-circuits 722 are connected so that CRC information stored therein can be rightwardly shifted. The rightward shift occurs after the n clock cycles executed to generate the CRC bytes in registers 705. After the n clock cycles are executed to generate the CRC bytes, the CRC bytes in registers 705 are shifted rightwardly a desired number of clocks (as input to controller 626), one register (e.g., one sub-circuit) per clock. For example, considering the operation of first CRC generator/checker 601, if an input value of 4 is inputted at input port $627_1$ of controller 626, during a first shift clock cycle the CRC byte in register $705_1$ is shifted out on CRC bus 716; the CRC byte in register $705_2$ is shifted into register $705_1$; the CRC byte in register $705_3$ is shifted into register $705_2$; and so forth. Such shifting continues for four shift clock cycles, so that the CRC values initially in registers $705_1$–$705_4$ are ultimately shifted out to CRC bus 716.

The values of the multipliers 704 are chosen so that the multiplier multiplies by a power of a field element α, the power being r+1 for the multiplier of the first sub-circuit $722_1$ and r+k for the multiplier of the $k^{th}$ sub-circuit $722_k$.

The output port of adder $703_1$ is connected to error checker circuit 714 and to MUX $708_k$. As illustrated in FIG. 7A, error checker circuit 714 comprises an 8-input OR gate 709 which is connected to the output port of adder $703_1$. Error checker circuit 714 further includes and AND gate 730 and an R/S flip-flop or latch 732. An output pin of OR gate 709 is connected to a first input pin of AND gate 730, a second input pin of AND gate 730 being connected to receive a signal CRC_TIME from controller 626. An output pin of AND gate 730 is connected to a set pin of flip-flop 732; a reset pin of flip-flop 732 receives a signal RST from controller 626. Since adder $703_1$ is involved in verifying previously-generated CRC information with currently generated CRC information in the manner hereinafter described, sub-circuit $722_1$ is denominated the "comparison" sub-circuit.

TWO STAGE ENCODING OPERATION

Figure 8:
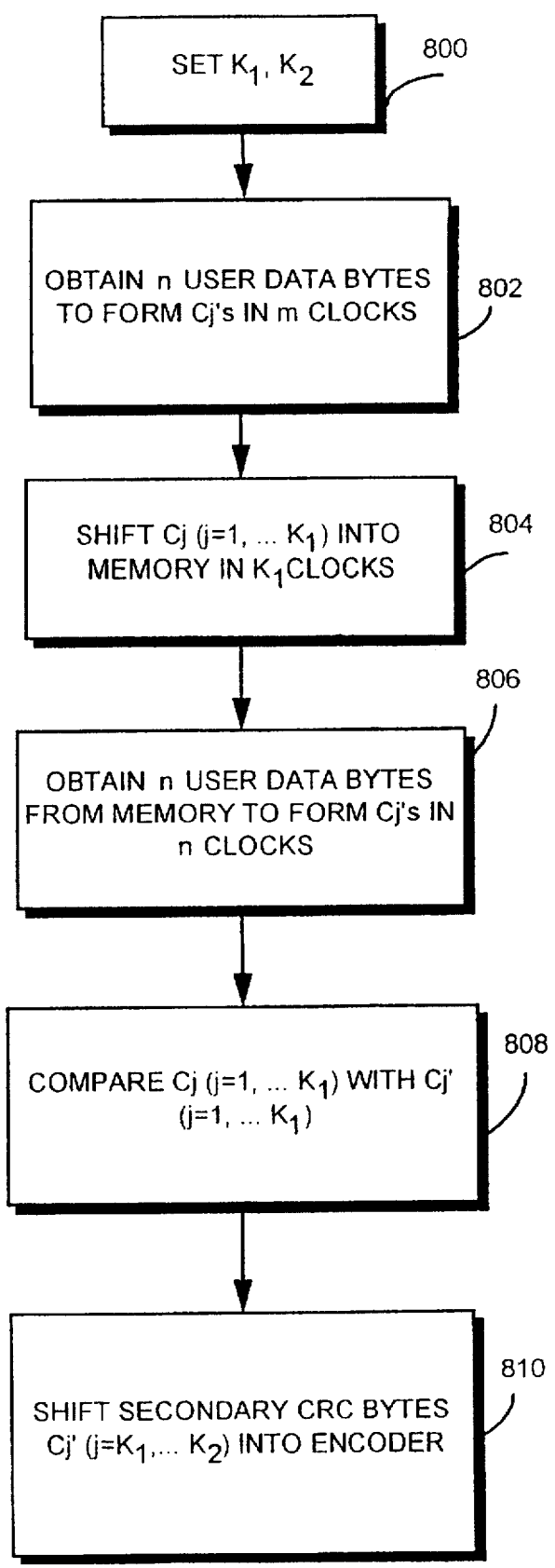
FIG. 8 is a flowchart depicting basic steps executed by the CRC generation system of FIG. 6 in connection with two stage CRC generation prior to encoding.

FIG. 8 depicts basic steps executed by system 600 of FIG. 6 in connection with two stage CRC generation prior to encoding. Prior to actual CRC generation, as depicted by step 800 of FIG. 8, controller 626 is programmed with values $K_1$ and $K_2$ for determining the amount (e.g., number of bytes ranging from 1 to k) of CRC information to be shifted out of first CRC generator 601 and second CRC generator 602, respectively.

In connection with encoding aspects of the CRC generation of system 600 of FIG. 6, bytes of user data from the host are sent to first CRC generator/checker 601 and are written into DRAM 602. Step 802 of FIG. 8 shows first CRC generator/checker 601 obtaining n bytes of user data from the host and using the n bytes of user data to form CRC bytes $C_j$ (j=1,2, . . . k) during n clock cycles. After the n clock cycles for generating CRC bytes $C_j$ (j=1,2, . . . k), during the next $K_1$ clock cycles (step 804) first CRC generator/checker 601 shifts CRC bytes $$C1, \ldots C_{k_1}$$

also known as the primary CRC bytes, into DRAM 602.

In connection with the execution of step 802, and specifically with reference to generator/checker 700 illustrated in FIG. 7, during the first of the n clock cycles multiplexer 701 switches the first of the n user data bytes onto adder input bus 720. Concerning such first byte obtained on line $707_0$ of segmenting circuit 710, $M_0$ for segmenting circuit 710 may always be selected as $α^0$ and hence no multiplier is needed for $M_0$. During the second of the n clock cycles multiplexer 701 switches the second of the n user data bytes (multiplied by $M_1$) onto adder input bus 720; during the third of the n clock cycles multiplexer 701 switches the third of the n user data bytes (multiplied by $M_2$) onto adder input bus 720.

Thus, during a data portion of generation or checking depicted by step 802, MUX 701 supplies the dividers (e.g., sub-circuits 722) with the input user data multiplied by $M_0$ (from lead $707_0$) on the first clock and on every third clock following the first, it supplies the dividers 722 with the input user data multiplied by $M_1$ (from lead $707_1$) on the second clock and on every third clock following the second and it supplies the dividers 722 with the input user data multiplied by $M_2$ (from lead $707_2$) on the third clock and on every third clock following the third. In execution of step 802, MUXes 702 supply adders 703 with the outputs of constant multipliers 704 on the first clock and on every third clock following the first. MUXes 702 supply the adders 703 with the outputs of registers 705 on the other clocks. MUXes 708 supply the adder outputs to the inputs of registers 705.

During execution of step 804, which is a CRC portion of CRC generation or checking, i.e. when CRC bytes are being output, MUXes 708 connect the registers 705 into one shift register. During generation this allows the programmed number ($K_1$) of CRC bytes which reside in the registers 705 to be shifted out onto CRC bus 716. $K_1$ clock cycles are required in step 804 to shift out the $K_1$ number of desired CRC bytes. After the $K_1$ clock cycles, all registers 705 are re-initialized at zero, so that CRC bytes $K_1 \ldots k$ are discarded.

As mentioned before, step 804 shows the shifting of the primary CRC bytes $C_j$ (j=1, ... $K_1$) into DRAM 602. At some later time (depicted by step 806), the block of data in DRAM 602 and the primary CRC bytes $C_j$ (j=1, ... $K_1$) are read from DRAM 602 and sent both to Reed-Solomon encoder 604 (via MUX 644) and to second CRC generator/checker 603 (via MUX 645). The data from the block in DRAM 602 is applied to second CRC generator/checker 603 in a manner such that n number of user data bytes are applied followed by the $K_1$ number of primary CRC bytes $C_j$ (j=1, ... $K_1$) generated by generator 601 with respect to those n bytes.

In step 806, second CRC generator/checker 603 receives the user data from DRAM 602 in groups of n number of input bytes. Using the n number of input bytes, during n number of clock cycles the second CRC generator/checker 603 generates k number of verification CRC bytes $C_j'$ in similar manner as first CRC generator/checker 601 generated the primary CRC bytes $C_j$. If the user data bytes obtained from DRAM 602 in step 806 are identical to the user data bytes shifted into DRAM 602 from the host as occurs when DRAM is operating properly, then the verification CRC bytes $C_j'$ will equal the respective primary CRC bytes $C_j$.

After second CRC generator/checker 603 has generated the verification CRC bytes $C_j'$ during the n clock cycles of step 806, at step 808 secondary CRC generator/checker 603 performs a checking operation to compare primary CRC bytes $C_j$ (j=1, ... $K_1$) with the verification CRC bytes $C_j'$ (j=1, ... $K_1$). In so doing, MUX 701 is operated to apply the primary CRC bytes $C_j$ (j=1, ... $K_1$) from line $707_0$ of segmenting circuit 710 to the first input port of ADDER $703_1$ the application being made one byte per clock cycle for each of $K_1$ number of verification clock cycles. During a first of the verification clock cycles, the first primary CRC byte $C_1$ is applied to the first input port of ADDER $703_1$ and the first verification CRC byte $C_1'$ stored in register $705_1$ is applied to the second input port of ADDER $703_1$, so that the result of the addition operation of ADDER $703_1$ is applied to check circuit 714. With each verification clock cycle, the verification CRC bytes $C_j'$ in registers $705_j$ are shifted rightwardly by one sub-circuit 722 (e.g., to the next rightwardly adjacent register), as in the manner of CRC byte shift/readout described hereinbefore, so that after the first verification clock cycle register $705_1$ will contain the verification CRC byte $C_2'$. Similarly, during a second of the verification clock cycles, the second primary CRC byte $C_2$ is applied to the first input port of ADDER $703_1$ and the second verification CRC byte $C_2'$ now stored in register $705_1$ is applied to the second input port of ADDER $703_1$, again with the result of the addition operation of ADDER $703_1$ is applied to check circuit 714. Such shifting and adding continues for each of the $K_1$ number of verification clock cycles, so that CRC bytes $C_j$ are compared with corresponding bytes $C_j'$ for j=1, ... $K_1$.

During execution of step 808, checker circuit 714 is effectively enabled by a signal CRC_TIME from controller 626. When checker circuit 714 is enabled, any inequality between a primary CRC byte $C_j$ and its corresponding verification byte $C_j'$ causes a non-zero output of OR gate 709 to be gated through AND gate 730 for application to flip-flop 732. The detected inequality causes flip-flop 732 to output a CRC ERROR signal to controller 626 on line 718.

If the value $K_2$ inputted to controller 626 with respect to second CRC generator/checker 603 is greater than the value $K_1$, then at step 810 second CRC generator/checker 603 will shift out (on line 716) a number ($K_2-K_1$) of secondary CRC bytes, specifically CRC bytes $C_j'$ (j=$K_1$+1, ... $K_2$). In this regard, after execution of step 808, registers $705_1$, $705_2$, $705_3$, etc. will contain $$C_{K_1+1}, C_{K_1+2}, C_{K_1+3}, \text{etc.}$$

The shifting out of secondary CRC bytes $C_j'$ (j=$K_1$+1, ... $K_2$) occurs in $K_2-K_1$ clock cycles, and is accomplished in the hereinbefore described manner of controlling multiplexers 708 for the rightward shift operation.

After a block of data including both the primary CRC bytes $C_j$ (j=1, ... $K_1$) and the secondary CRC bytes $C_j'$ (j=$K_1$, ... $K_2$) is encoded by encoder 604, the encoded block is written to disk subsystem 605. It will be appreciated by the man skilled in the art that encoder 604 generates ECC bytes for each interleave of data, preferably m number of interleaves using a ECC generator polynomial.

Thus, second CRC generator/checker 603 checks whether errors occurred in DRAM 602 and also may generate additional CRC bytes, known as secondary CRC bytes. These secondary CRC bytes may be written to the disk along with the primary CRC bytes. Inclusion of the secondary CRC bytes can be important because the data read from disk may require more protection than the DRAM data owing to the fact that data from disk is more susceptible to error than data from DRAM 602.

As described above, second CRC generator/checker 603 allows the incoming primary CRC bytes to be checked one at a time. It also shifts out as many of the k-$K_1$ remaining CRC bytes as are specified by the input value $K_2$, these further shifted bytes being secondary CRC bytes). This facilitates a situation in which only the first $K_1$ number of primary CRC bytes are written into the DRAM 602 but $K_2$ are written to disk ($K_2$>$K_1$). The checking of the primary CRC bytes is accomplished by adding the incoming primary CRC bytes to the newly generated verification CRC bytes by adder $703_1$ and then detecting a non-zero byte with OR gate 709. While CRC bytes are being input to the checker the CRC_TIME signal is ON and then any miscompares will set CRC_ERROR latch 732. The order of the generator is programmable since the CRC bytes are calculated independently of each other and hence only the desired number of CRC bytes need be shifted out.

TWO STAGE DECODING OPERATION

In connection with a decoding operation executed by system 600 of FIG. 6, a data block is read from the disk by disk sub-system 605 and is sent to Reed-Solomon decoder 606. Corrected data obtained by decoder 606 (including CRC bytes) is sent both to second CRC generator/checker 603 (to check for uncorrectable errors) and to DRAM 602.

Second CRC generator/checker 603 receives data bytes and CRC bytes from the decoded block in much the same manner as it does prior to an encoding operation. Upon receiving each group of n data bytes, second CRC generator/checker 603 generates $K_2$ number of verification CRC bytes for comparison with a like number of corresponding CRC bytes obtained from the decoded data. Operation of the second CRC generator/checker 603 in connection with post-decode CRC processing is analogous to steps 806 and 808 above-discussed, and understood with reference thereto. Second CRC generator/checker 603 performs a verification with respect to CRC bytes obtained from the disk subsystem 605.

In connection with post-decode CRC processing, when the data block is retrieved from DRAM 602 for sending to the host, the data block is again sent to first CRC generator/checker 601 to check for DRAM errors. Operation of the first CRC generator/checker 601 in connection with post-decode CRC processing is also analogous to steps 806 and 808 above-discussed, and understand with reference thereto, with the proviso that $K_1$ number of CRC bytes are processed by the first CRC generator/checker 601.

OPERATION: MATHMATICAL BASES

In the illustrated embodiments, the data stream which feeds the CRC generator/checker 700 is segmented into groups of three bytes. A linear combination of the three bytes is then sent to a collection of circuits (e.g., sub-circuits 722) which divide by $X+\alpha^{r+j}$ for $j=1, 2, \ldots, k$ where $\alpha$ is a primitive element of the field representation of the data bytes. In the preferred embodiment the field is $GF(256=2^8)$. The linear combination may be a simple sum, leading to the embodiment shown in FIG. 4A.

While a simple linear combination may be simple to implement, it is possible to have two bytes each with a single bit error in a block of data read from the DRAM which are not detectable owing to the fact that if the same error is in two bytes of a three-byte group then the two errors will cancel when summed together before being sent to the CRC generator/checker 700. Alternately the linear combination can be chosen so that if the three bytes in the group each have no more than a single "1" in each byte, then the linear combination will be non-zero. In that case, if every byte in error in a block of data contains only a single bit in error, then k CRC bytes can be used to detect k bytes in error even if some of the bytes in error are in the same three-byte group.

Using a linear combination of every three input bytes allows the CRC bytes to be generated in such a way as to increase the minimum distance of the ECC code by one for each CRC byte. This can be done because the ECC consists of three interleaves.

The CRC bytes are generated according to the following rule: Let the input bytes be denoted as $D_0$ to $D_{n-1}$. These bytes make up the coefficients of three polynomials, $F^0$ (x), $F^1$ (x) and $F^2$ (x), thusly:

$$F^s(x) = \sum_{k=0}^{t_s} D_{(3-k)+s} \cdot x^{t_s-k}$$

for s=0, 1, 2 where $t_s$ is the largest integer that is less than (n-s)/3. These polynomials represent the division of D(x) into three groups, e.g. $D_0$ is in $F^0$, $D_1$ is in $F^1$, $D_2$ is in $F^2$, $D_3$ is in $F^0$, etc. These polynomials are precisely the same polynomials that are processed by the Reed-Solomon encoder 604 to form the three Reed-Solomon code words. G(x) is defined as a linear combination of $F^0$ (x), $F^1$ (x) and $F^2$ (x) thusly:

$$G(x) = \sum_{s=0}^{2} M_s \cdot F^s(x)$$

The system 400A in FIG. 4A corresponds to the case where the multipliers, $M_s$, are all 1. The system 600 in FIG. 6 corresponds to the case where the $M_s$ are chosen so that $aM_0+bM_1+cM_3$ is non-zero as long as a, b and c each contain a single "1". The coefficients of G(x) are linear combinations of three consecutive input bytes, e.g. the first coefficient of G(x) is $D_0M_0+D_1M_{1+D2}M_2$, the second coefficient of G(x) is $D_3M_0+D_4M_{1+D5}M_2$, etc.

The $j^{th}$ CRC byte, $C_j$, is defined as:

$$C_j = G(x) \bmod (x + \alpha^{r+j})$$

for $j=1, 2, \ldots, k$.

If only k or less of the input bytes $D_i$ were non-zero, and the non-zero bytes each consisted of a single "1", then G(x) would have at most k non-zero coefficients and G(x) could not be zero. All of the CRC bytes are obtained by dividing G(x) by consecutive powers of $\alpha$, and therefore if there are k CRC bytes then at least one of the CRC bytes would be non-zero. This is equivalent to saying that any set of k or less single-bit errors would be detected.

The Reed-Solomon code to be used in conjunction with the new CRC generator has a generator polynomial which has, as roots, v consecutive powers of $\alpha$, from $\alpha^{r-v+1}$ to $\alpha^r$. Let E(x) be an error polynomial which has been added to one of the ECC interleaves, i.e. one of the Reed-Solomon code words. If the error is not detectable by the ECC, then E(x) must have roots which include $\alpha^{r-v+1}$ to $\alpha^r$. Since the factors used in CRC generation have as roots the k consecutive powers of $\alpha$, from $\alpha^{r+k}$, for the error not to be detected by the CRCs, $M_s E(x)$ must have roots which include $\alpha^{r+1}$ to $\alpha^{r+k}$. This implies that E(x) must have roots which include $\alpha^{r-v+1}$ to $\alpha^{r+k}$, which means that the error has more than k+v bytes in error.

The set of $M_1$ and $M_2$ constants which cause $a+bM_1+cM_2$ to be non-zero for all a, b and c which have a single "1" is not unique. Therefore $M_1$ and $M_2$ are picked to satisfy that condition and to also cause linear combinations of other classes to be non-zero. For example, in the preferred embodiment the field generator polynomial is $X^8+X^4+X^3+X^2+1$. $M_1$ is chosen to be $\alpha^{25}$ and $M_2$ is chosen to be $\alpha^{112}$. This choice causes $a+bM_1+cM_2$ to be non-zero for the case where only two of the three bytes a, b and c are non-zero and the two bytes each have a single 3-bit or shorter non-zero bit sequence. After adding this condition the choice of $M_1$ and $M_2$ is still not unique, therefore an additional condition is added which is to maximize the number of two-byte combinations where each byte can have a single 4-bit or shorter non-zero bit sequence. The $M_1$ and $M_2$ multipliers each consist of a set of XOR gates such that the output bits are linear combinations, i.e. XOR sums, of certain subsets of the input bits and these subsets are listed in Table I and Table II.

TABLE I

| $M_1$ multiplier |
| --- |
| OUT0 = IN0 + IN7 |
| OUT1 = IN0 + IN1 |
| OUT2 = IN1 + IN2 + IN7 |
| OUT3 = IN2 + IN3 + IN7 |
| OUT4 = IN3 + IN4 + IN7 |
| OUT5 = IN4 + IN5 |
| OUT6 = IN5 + IN6 |
| OUT7 = IN6 + IN7 |

TABLE II

M$_2$ multiplier

```
OUT0 = IN0 + IN1 + IN5 + IN6 + IN7
OUT1 = IN1 + IN2 + IN6 + IN7
OUT2 = IN1 + IN2 + IN3 + IN5 + IN6
OUT3 = IN1 + IN2 + IN3 + IN4 + IN5
OUT4 = IN1 + IN2 + IN3 + IN4 + IN7
OUT5 = IN2 + IN3 + IN4 + IN5
OUT6 = IN3 + IN4 + IN5 + IN6
OUT7 = IN0 + IN4 + IN5 + IN6 + IN7
```

For example, the CRC generator/checker of this invention has been illustrated in conjunction with a three-way interleaved Reed-Solomon code. It may alternately be employed with, for example, a two-way or four-way interleaved code. The principles taught with the illustrated CRC can be applied to a CRC for use in conjunction with encoders not limited to the Reed-Solomon design. The method of this invention can be used for codeword generation, codeword checking or both. It can be used between a computer host and a DRAM, between a DRAM and a magnetic disk, or between two ends of any communication channel. The same CRC can be used in more than one communication channel of a system, for example both between the host and a DRAM and between the DRAM and storage disk.

The CRC of this invention can be programmed to generate k CRC bytes. In conjunction with a Reed-Solomon code the CRC allows detection of k more errors than the Reed-Solomon code is capable of detecting. The number k can be tailored to the propensity for errors of a given communication channel. When the same CRC is used for more than one communication channel, different values of k can be selected for each channel. The CRC of this invention can also be utilized in a non-programmable embodiment having a fixed number of CRC bytes.

A hardware implementation of this invention has been illustrated. The CRC can also be implemented with software. Specific circuitry to implement the block diagram of FIG. 7 of this invention can be readily designed by a routiner in the electronic arts. Variations on the block diagram will also be apparent to those skilled in the art. Specific examples of a field generator polynomial and of the constant multipliers M$_s$ have been supplied. Other constants and polynomials can be chosen, as taught herein. For example, instead of dividing by two eight bit polynomials, division can instead occur with one sixteen bit polynomial.

U.S. patent application Ser. No. 08/326,126 simultaneously filed by Zook et al., entitled "ERROR CORRECTION METHOD AND APPARATUS", and incorporated herein by reference, provides one non-limiting example of a specific utilization of the present invention.

While the preferred embodiment has been disclosed and described in detail herein, it will be obvious to those skilled in the art that various changes in form and detail may be made therein without departing from the spirit and scope thereof.

The embodiments of the invention in which an exclusive property or privilege is claimed are defined as follows:

1. An error correction generator comprising:
   an interleaving circuit for dividing an input stream of data into a plurality of interleaves;
   a circuit which forms a linear combination of the plurality of interleaves and operates upon the linear combination in order to generate cyclical redundancy check (CRC) information; and
   an error correction circuit which generates error correction (ECC) information using the input stream and the CRC information;
   wherein the interleaving circuit divides the input stream into three interleaves.

2. An error correction generator comprising:
   an interleaving circuit for dividing an input stream of data into a plurality of interleaves;
   a circuit which forms a linear combination of the plurality of interleaves and operates upon the linear combination in order to generate cyclical redundancy check (CRC) information; and
   an error correction circuit which generates error correction (ECC) information using the input stream and the CRC information;
   wherein the interleaving circuit includes a multiplier for multiplying at least one of the interleaves by a constant.

3. The apparatus of claim 2, wherein the multiplier is chosen so that a linear combination of certain bytes is non-zero.

4. The apparatus of claim 3, wherein the constant is a power of a field element $\alpha$.

5. The apparatus of claim 4, wherein there are three interleaves, wherein each byte of one interleave is multiplied by a constant M$_1$, each byte of another interleave is multiplied by a constant M$_2$, and wherein M$_1=\alpha^{25}$ and M$_2=\alpha^{112}$.

6. An error correction generator comprising:
   an interleaving circuit for dividing an input stream of data into a plurality of interleaves;
   a circuit which forms a linear combination of the plurality of interleaves and operates upon the linear combination in order to generate cyclical redundancy check (CRC) information; and
   an error correction circuit which generates error correction (ECC) information using the input stream and the CRC information;
   wherein the circuit which forms a linear combination of the plurality of interleaves and operates upon the linear combination in order to generate the CRC information comprises k number of sub-circuits for generating k bytes of CRC information with respect to the linear combination of interleaves.

7. An error correction generator comprising:
   an interleaving circuit for dividing an input stream of data into a plurality of interleaves;
   a circuit which forms a linear combination of the plurality of interleaves and operates upon the linear combination in order to generate cyclical redundancy check (CRC) information; and
   an error correction circuit which generates error correction (ECC) information using the input stream and the CRC information;
   wherein each interleave forms at least part of a data polynomial, and wherein the circuit which forms a linear combination of the plurality of interleaves and operates upon the linear combination in order to generate the CRC information comprises k number of divider sub-circuits for generating k bytes of CRC information with respect to the linear combination of interleaves.

8. The apparatus of claim 7, wherein each divider sub-circuit divides the data polynomial by a divisor which is related to a root of an ECC polynomial.

9. An error correction generator comprising:
   means for dividing an input stream of data into a plurality of interleaves;
   means for forming a linear combination of the plurality of interleaves and operating upon the linear combination in order to generate cyclical redundancy check (CRC) information; and an error correction circuit which generates error correction (ECC) information using the input stream and the CRC information;

wherein the dividing means divides the input stream into three interleaves.

10. An error correction generator comprising:

means for dividing an input stream of data into a plurality of interleaves;

means for forming a linear combination of the plurality of interleaves and operating upon the linear combination in order to generate cyclical redundancy check (CRC) information; and an error correction circuit which generates error correction (ECC) information using the input stream and the CRC information;

wherein the dividing means multiplies at least one of the interleaves by a constant.

11. The apparatus of claim 10, wherein the constant is chosen so that a linear combination of certain bytes is non-zero.

12. The apparatus of claim 11, wherein the constant is a power of a field element $\alpha$.

13. The apparatus of claim 12, wherein there are three interleaves, each interleave constituting a byte of data, and wherein one interleave is multiplied by a constant $M_1$ and another interleave is multiplied by a constant $M_2$, and wherein $M_1 = \alpha^{25}$ and $M_2 = \alpha^{112}$.

14. An error correction generator comprising:

means for dividing an input stream of data into a plurality of interleaves;

means for forming a linear combination of the plurality of interleaves and operating upon the linear combination in order to generate cyclical redundancy check (CRC) information; and an error correction circuit which generates error correction (ECC) information using the input stream and the CRC information;

wherein each interleave forms at least part of a data polynomial, and the means for forming a linear combination of the plurality of interleaves and for operating upon the linear combination in order to generate the CRC information comprises k number of dividers for generating k bytes of CRC information with respect to the linear combination of interleaves.

15. The apparatus of claim 14, wherein each divider divides the data polynomial by a divisor which is related to a root of an ECC polynomial.

16. The apparatus of claim 14, wherein the means for forming a linear combination of the plurality of interleaves and for operating upon the linear combination in order to generate the CRC information outputs $K_1$ number of bytes of CRC information, $K_1$ being a constant less than or equal to k.

17. The apparatus of claim 16, wherein $K_1$ is programmable.

18. An error correction method comprising:

dividing an input stream of data into a plurality of interleaves; and, forming a linear combination of the plurality of interleaves and operating upon the linear combination in order to generate cyclical redundancy check (CRC) information; and then using the input stream and the CRC information to generate error correction (ECC) information;

wherein the input stream is divided into three interleaves.

19. An error correction method comprising:

dividing an input stream of data into a plurality of interleaves; and, forming a linear combination of the plurality of interleaves and operating upon the linear combination in order to generate cyclical redundancy check (CRC) information; and then using the input stream and the CRC information to generate error correction (ECC) information;

multiplying at least one of the interleaves by a constant.

20. The method of claim 19, wherein the constant is chosen so that the linear combinations of the interleaves are non-zero.

21. The method of claim 20, wherein the constant is a power of a field element $\alpha$.

22. The method of claim 21, wherein there are three interleaves, wherein each byte of one interleave is multiplied by a constant $M_1$ and each byte of another interleaved is multiplied by a constant $M_2$, and wherein $M_1 = \alpha^{25}$ and $M_2 = \alpha^{112}$.

23. A cyclical redundancy check (CRC) method which generates CRC information for error checking purposes, the method comprising:

dividing an input stream of data into a plurality of interleaves;

forming a linear combination of the plurality of interleaves and operating upon the linear combination in order to generate the CRC information by applying the plurality of interleaves to k number of sub-circuits for generating k bytes of CRC information with respect to the linear combination of interleaves, the sub-circuits being numbered from a first sub-circuit to a $k^{th}$ sub-circuit; and storing CRC information in a register of each sub-circuit and shifting CRC information stored in the register of the $k^{th}$ sub-circuit to the register of the first sub-circuit.

24. The method of claim 23, wherein for sub-circuit j, the linear combination applied thereto is divided by a factor related to a root of an ECC polynomial.

25. The method of claim 23, further comprising storing CRC information in a register of each sub-circuit and shifting CRC information stored in the register of the $k^{th}$ sub-circuit to the register of the first sub-circuit.

26. The method of claim 23, further comprising comparing a CRC value inputted to a comparison one of the sub-circuits to CRC information stored in the register of the comparison sub-circuit.

27. An error correction method comprising:

(a) performing an error correction operation on an input stream of data obtained from a communications channel to obtain a corrected input stream including corrected CRC information, then (b) dividing data in the corrected input stream of data into a plurality of interleaves;

(c) forming a linear combination of the plurality of interleaves and operating upon the linear combination in order to generate the cyclical redundancy check (CRC) information;

(d) comparing the generated CRC information with the corrected CRC information obtained from the communication channel; and (e) producing an error signal when a discrepancy is detected between the generated CRC information and the corrected CRC information obtained from the communication channel.

28. The method of claim 27, wherein the CRC information generated in step (b) constitutes $K_1$ number of bytes stored in registers j=1, ... k, wherein the decoded CRC information constitutes $K_1$ number of decoded CRC bytes j=1, ... k sequentially applied to a comparator, and wherein the comparison step comprises using the comparitor to compare the contents of register j with decoded CRC byte j.

29. The method of claim 28, wherein $K_1$ is a programmable integer.

30. The method of claim 27, further comprising sequentially shifting $K_1-1$ number of values stored in registers j=2, ... k into a selected one of the registers for comparison with a corresponding decoded CRC byte.

31. The method of claim 30, wherein $K_1$ is a programmable integer.

32. An error correction system comprising:
a host port connected to a host device;
a first cyclical redundancy check (CRC) generator connected to the host port for generating primary CRC information based on input data received from the host device;
a semiconductor memory for storing therein input data received from the host device and the primary CRC information generated with respect thereto by the first CRC generator;
a second cyclical redundancy check (CRC) generator connected to the semiconductor memory for generating verification CRC information for checking data retrieved from the semiconductor memory;
an encoder connected to form encoded information for storage on a peripheral storage device, the encoded information being formed by utilizing the data retrieved from the semiconductor memory including the primary CRC information.

33. The apparatus of claim 32, wherein the second CRC generator compares the primary CRC information and the verification CRC information generated by the second CRC generator to determine errors attributable to the semiconductor memory.

34. The apparatus of claim 32, wherein the second CRC generator also generates secondary CRC information based on data obtained from the semiconductor memory; and wherein the encoder is also connected to the second CRC generator and also utilizes the secondary CRC information to form the encoded information.

35. The apparatus of claim 32, further comprising:
a utilization port connected to a utilization channel;
a decoder connected to receive input data at the utilization port and to decode the input data into decoded input data including decoded CRC information, the decoder being connected to apply the decoded input data including the decoded CRC information to the second CRC generator and to the semiconductor memory, the second CRC generator validating decoded CRC information included in the decoded input data, and
wherein the first CRC generator is connected to receive decoded input data including the decoded CRC information stored in the semiconductor memory for validating decoded CRC information received from the semiconductor memory.

36. The apparatus of claim 32, wherein the first CRC generator comprises:
an interleaving circuit for dividing an input stream of data into a plurality of interleaves;
a circuit which forms a linear combination of the plurality of interleaves and operates upon the linear combination in order to generate the CRC information.

37. The apparatus of claim 32, wherein the second CRC generator comprises:
an interleaving circuit for dividing an input stream of data into a plurality of interleaves;
a circuit which forms a linear combination of the plurality of interleaves and operates upon the linear combination in order to generate the CRC information.

38. A cyclical redundancy check (CRC) method comprising:
using a first cyclical redundancy check (CRC) generator to generate primary CRC information based on input data received from a host device;
storing in a semiconductor memory the input data received from the host device and the primary CRC information generated with respect thereto by the first CRC generator;
using a second cyclical redundancy check (CRC) generator connected to the semiconductor memory for generating verification CRC information with respect to data retrieved from the semiconductor memory;
forming encoded information by utilizing the data retrieved from the semiconductor memory including the primary CRC information for storage on a peripheral storage device.

39. The method of claim 38, further comprising using the second CRC generator to compare the primary CRC information and verification CRC information generated by the second CRC generator to determine errors attributable to the semiconductor memory.

40. The method of claim 38, further comprising:
decoding input data received from a utilization channel into decoded input data including decoded CRC information;
applying the decoded input data including the decoded CRC information to the second CRC generator and to the semiconductor memory;
storing the decoded input data including the decoded CRC information in the semiconductor memory;
using the second CRC generator to validate the decoded CRC information included in the decoded input data;
applying the decoded input data including the decoded CRC information from the semiconductor memory to the first CRC generator; and
using the first CRC generator to validate the decoded CRC information received from the semiconductor memory.

41. The method of claim 38, wherein the second CRC generator generates secondary CRC information with respect to data retrieved from the semiconductor memory.

42. The method of claim 41, further comprising forming the encoded information by also using the secondary CRC information.

43. An error correction encoding method comprising:
generating v number of ECC bytes for each m-way interleaved Reed-Solomon codeword over a corresponding one of m number of interleaves, the roots of the Reed-Solomon codeword being $\alpha^{r-v+1}$ to $\alpha^r$, where v and m are integers and r and v are predetermined integers;
generating k number of CRC bytes over a CRC input byte sequence, k being an integer, wherein the CRC input byte sequence is formed by taking a linear combination of the m number of interleaves, and wherein the k number of CRC bytes is generated by dividing the CRC input byte sequence by factors $(x+\alpha^{r+1})$ to $(x+\alpha^{r+k})$ and taking the remainder.

44. The method of claim 43, wherein the integer k is programmably selected.

45. The method of claim 43, wherein the linear combination is obtained by summing over all products of the form $M_j \times D_j$ where $M_j$ is a constant multiplier and $D_j$ is a byte from a jth interleave, wherein j ranges from 0 to m−1.

46. The method of claim 45, wherein $M_j$ is selected so that the linear combination of certain predetermined sets of m bytes is always non-zero.

47. The method of claim 46, wherein m is 3 and the sets consists of 3 bytes where no byte has more than a single "1".

48. The method of claim 46, wherein m is 3 and the sets consists of 3 bytes where one byte is all zeros and the remaining two bytes contain a non-zero sequence of length no more than 4.

49. An error correction encoding apparatus comprising:

a CRC generator which generates k number of CRC bytes over a CRC input byte sequence, k being an integer, wherein the CRC input byte sequence is formed by dividing a data input stream into m number of interleaves and taking a linear combination of the m number of interleaves, and wherein the k number of CRC bytes is generated by dividing the CRC input byte sequence by factors $(x+\alpha^{r+1})$ to $(x+\alpha^{r+k})$ and taking the remainder;

an ECC generator which generates v number of ECC bytes for each m-way interleaved Reed-Solomon codeword over a corresponding one of m number of interleaves, the roots of the Reed-Solomon codeword being $\alpha^{r-v+1}$ to $\alpha^r$, where v and m are integers and r and v are predetermined integers.

50. The apparatus of claim 49, wherein the integer k is programmably selected.

51. The apparatus of claim 49, wherein the linear combination is obtained by summing over all products of the form $M_j \times D_j$ where $M_j$ is a constant multiplier and $D_j$ is a byte from a jth interleave, wherein j ranges from 0 to m−1.

52. The apparatus of claim 51, wherein $M_j$ is selected so that the linear combination of certain predetermined sets of m bytes is always non-zero.

53. The apparatus of claim 52, wherein m is 3 and the sets consists of 3 bytes where no byte has more than a single "1".

54. The apparatus of claim 52, wherein m is 3 and the sets consists of 3 bytes where one byte is all zeros and the remaining two bytes contain a non-zero sequence of length no more than 4.

55. An error correction encoding method for encoding a data input stream, the method comprising:

dividing the data input stream into m number of interleaves;

generating k number of CRC bytes over the m number of interleaves;

generating ECC bytes over the input data stream whereby it takes an error of a first predetermined number of bytes not to be detected by the ECC bytes; and wherein, the k number of CRC bytes and the ECC bytes are so formed over the interleaves whereby it takes an error of a second predetermined number of bytes not to be detected, the second predetermined number being equal to a sum of the first predetermined number and k.

56. The method of claim 55, wherein the k number of CRC bytes are formed by taking a linear combination over the m number of interleaves.

57. The method of claim 56, wherein the linear combination is formed whereby no two single bit errors can cancel each other.

58. An error correction apparatus for encoding a data input stream, the apparatus comprising:

an interleaver for dividing the data input stream into m number of interleaves;

a CRC generator which generates k number of CRC bytes over the m number of interleaves;

an ECC generator which generates ECC bytes over the input data stream whereby it takes an error of a first predetermined number of bytes not to be detected by the ECC bytes; and wherein, the k number of CRC bytes and the ECC bytes are so formed over the interleaves whereby it takes an error of a second predetermined number of bytes not to be detected, the second predetermined number being equal to a sum of the first predetermined number and k.

59. The apparatus of claim 58, wherein the k number of CRC bytes are formed by taking a linear combination over the m number of interleaves.

60. The apparatus of claim 59, wherein the linear combination is formed whereby no two single bit errors can cancel each other.

61. An error correction encoding method for encoding an input data stream for recordation on a storage medium, the method comprising:

dividing an input data stream into interleaves;

generating both CRC bytes and ECC bytes over same ones of the interleaves to increase a minimum distance of codewords written on the storage medium;

the CRC bytes being generated whereby single bit random errors retrieved from a temporary memory do not cancel, the temporary memory being used in the method to store temporarily the input data stream and the CRC bytes.

62. An error correction encoding apparatus for encoding an input data stream for recordation on a storage medium, the apparatus comprising:

an interleaver for dividing an input data stream into interleaves;

a CRC generator and an ECC generator for respectively generating both CRC bytes and ECC bytes over same ones of the interleaves to increase a minimum distance of codewords written on the storage medium, the CRC bytes being generated whereby single bit random errors retrieved from a temporary memory do not cancel, the temporary memory being used in the method to store temporarily the input data stream and the CRC bytes.

* * * * *